United States Patent [19]

Valdmanis

[11] Patent Number: 4,742,577
[45] Date of Patent: May 3, 1988

[54] DEVICE AND METHOD FOR SIGNAL TRANSMISSION AND OPTICAL COMMUNICATIONS

[75] Inventor: Janis A. Valdmanis, Westfield, N.J.

[73] Assignee: American Telephone and Telegraph Company, AT&T Bell Laboratories, Murray Hill, N.J.

[21] Appl. No.: 872,239

[22] Filed: Jun. 6, 1986

[51] Int. Cl.⁴ ............................................. H04B 9/00
[52] U.S. Cl. ................................. 455/618; 324/77 K; 350/356; 455/610
[58] Field of Search ............. 370/3; 324/77 C, 77 CS, 324/77 K; 364/822; 350/356, 358; 455/609, 618, 610

[56] References Cited

U.S. PATENT DOCUMENTS

| 3,055,258 | 9/1962 | Hurvitz | 324/77 K |
| 3,883,803 | 5/1975 | Donald et al. | 324/77 K |
| 4,446,425 | 5/1984 | Valdmanis et al. | 324/77 K |
| 4,482,863 | 11/1984 | Auston et al. | 324/158 |

OTHER PUBLICATIONS

Cooper—"Some Methods of Signal Processing"—The Radio and Electronic Engineer—Jul. 1966, pp. 5-13.
"Measurement of GaAs Field-Effect Transistor Electronic Impulse Response by Picosecond Optical Electronics", *Applied Physics Letters*, vol. 39 (1981), pp. 739-741, by P. R. Smith et al.
"Picosecond Optical Electronics for High-Speed Instrumentation", *Laser Focus Magazine*, 1982, pp. 89-93, by D. H. Auston et al.
"Picosecond Electro-Optic Sampling System", *Applied Physics Letters*, vol. 41 (1982), pp. 211-212, by J. A. Valdmanis et al.

*Primary Examiner*—Joseph A. Orsino, Jr.
*Attorney, Agent, or Firm*—Peter A. Businger

[57] ABSTRACT

An optical pulse having time-dependent spectral variation is modulated by a time-dependent signal so that, upon determination of the spectral content of the modulated pulse, a representation of the signal can be obtained. Frequency in the optical pulse preferably varies essentially unidirectionally, i.e., aside from noise, each frequency is encountered just once as, e.g., in a linear relationship. Such an optical pulse can be produced by passing a short laser pulse through a dispersive medium such as, e.g., an optical fiber whose zero-dispersion wavelength is away from wavelengths to be dispersed. Modulation of the optical pulse may be by electrooptic interaction. The technique can be used for the characterization of device and material responses; envisaged also are communications applications.

13 Claims, 1 Drawing Sheet

DEVICE AND METHOD FOR SIGNAL TRANSMISSION AND OPTICAL COMMUNICATIONS

TECHNICAL FIELD

The invention is concerned with methods and devices for transmitting high-speed signals such as, e.g., picosecond and subpicosecond signals originating in devices and materials, as well as with methods and devices for optical communications.

BACKGROUND OF THE INVENTION

As ever higher levels of performance are being sought in computing and communications devices, there is a need for increasingly sensitive methods and instruments for evaluating material and device characteristics such as, e.g., response times and pulse shapes. In this respect, however, the development of electronic sampling oscilloscopes of the currently available type is estimated as having reached a point at which significant further increases in response speed are unlikely. As a result, alternate methods are being sought especially for investigating signals having time-dependent characteristics which may range from a few hundred picoseconds down to the subpicosecond range.

One approach which represents an alternative to the use of an electronic sampling oscilloscope is based on the generation of electrical signals upon illumination of a device or photoconductive material by optical pulses as disclosed in U.S. Pat. No. 4,482,863, issued Nov. 13, 1984 to D. H. Auston et al. In this approach, optical pulses are used both to generate as well as to sample electrical events and, if the device or material being tested is photosensitive itself, optical pulses may be made incident directly on the device or material being tested. For further details in this respect see the papers by P. R. Smith et al., "Measurement of GaAs Field-effect Transistor Electronic Impulse Response by Picosecond Optical Electronics", Applied Physics Letters, Vol. 39 (1981), pp. 739–741 and by D. H. Auston et al., "Picosecond Optical Electronics for High-speed Instrumentation", Laser Focus Magazine, April 1982, pp. 89–93.

Another approach to the characterization of ultrafast signals is based on electrooptic sampling; this represents an electric field-sensitive technique in which ultrashort optical pulses serve as "sampling gates" for electrical transients as they simultaneously propagate through an electrooptic medium. In this respect, see U.S. Pat. No. 4,446,425, issued May 2, 1984 to J. A. Valdmanis et al., the paper by J. A. Valdmanis et al., "Picosecond Electro-optic Sampling System", Applied Physics Letters, Vo. 41 (1982), pp. 211–212, and the paper by J. A. Valdmanis et al., "Subpicosecond Electrooptic Sampling: Principles and Applications", *IEEE Journal of Quantum Electronics*, Vol. QE-22 (1986), pp. 69–78.

While methods disclosed in the cited references are based on sampling a repetitive train of pulses, methods are desired also for characterizing signals which are non-repetitive. Methods of such latter type, and devices for their implementation, not only are potentially useful for testing and measurement purposes but may be used also in the field of telecommunications.

SUMMARY OF THE INVENTION

An optical pulse having time-dependent spectral variation is amplitude-modulated in a time-dependent fashion so as to alter the spectral content of the pulse. Upon determination of the spectral content of the pulse, a representation of the modulating signal can be obtained. A signal of interest typically has characteristics ranging from a few hundred picoseconds down to the subpicosecond range, and its sensing may involve any physical phenomenon which interacts with light; e.g., electrical, magnetic, or electromagnetic phenomena are suitable in this respect. Spectral variation in the optical pulse is preferably essentially unidirectional, i.e., aside from noise, frequency in the pulse is either steadily increasing or else steadily decreasing.

A signal representation obtained in this fashion may be of interest, e.g., for the determination of a characteristic of a device or material being tested. Also, such representation may contain digital or analog information to be transmitted for the purpose of communications.

DETAILED DESCRIPTION

Figure 1:
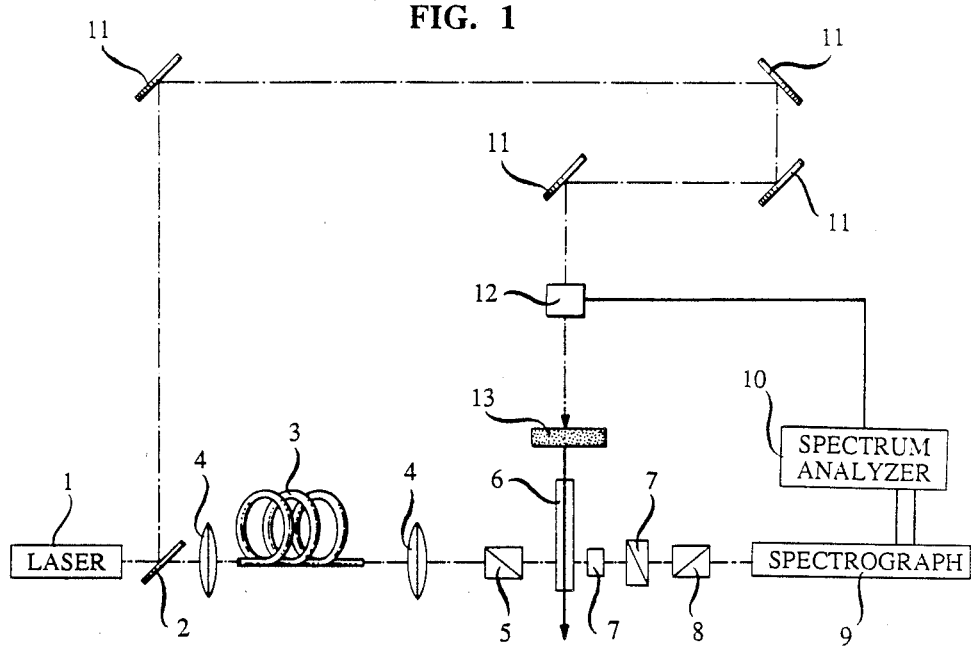
FIG. 1 is a schematic representation of an arrangement or device for characterizing a time-dependent electrical waveform by transmission of a signal in accordance with the invention.

Shown in FIG. 1 are laser 1, beam splitter 2, frequency-dispersive optical fiber 3 with input and output focusing lenses 4, optical polarizer 5, electrooptic modulator 6, compensators 7, polarization analyzer 8, spectrograph 9, spectrum analyzer 10, mirrors 11 forming a fixed-length delay line, and chopper 12 which is electrically connected to spectrum analyzer 8 for synchronization. Positioned in the light path between chopper 12 and modulator 6 is a device 13 to be tested.

Functioning of the arrangement depicted in FIG. 1 can be described as follows: A laser pulse is split into two beams by splitter 2, one beam propagating into optical fiber 3 via a lens 4, the other passing along a delay path formed by mirrors 11. The latter, here designated as trigger beam, initiates the generation of a signal of interest; the former, here designated as probe beam, undergoes frequency dispersion resulting, e.g., in lower frequencies moving ahead of higher frequencies as it emerges from optical fiber 3.

Such a pulse may be designated as a frequency-swept, wavelength-swept, or "chirped" pulse, such pulse having preferred frequency dispersion which, aside from noise, is unidirectional as a function of time of passage. Accordingly, light of any one frequency preferably is encountered not more than once as the pulse passes, an essentially linear relationship between frequency and time being convenient and preferred. Frequency dispersion can be positive or negative, i.e., lower frequencies may travel ahead of higher frequencies or vice-versa, and both types of dispersion can be produced, e.g., by suitably chosen optical fibers. Dispersion can also be produced by other means, gratings being considered as particularly suitable for this purpose.

The frequency-swept probe pulse is polarized by polarizer 5, and the polarizied light passes through the electro-optical modulator 6 where it is phase-modulated by the electrical signal originating from device 13. The length of the delay line formed by mirrors 11 is chosen to ensure that the electrical signal arrives within the optical "measurement window" defined by passage of the probe pulse. Thus, an entire signal of interest can be measured with the passing of a single optical pulse.

The modulated light passes through analyzer 8 so that, at this point, its intensity becomes modulated as a function of phase modulation. (Compensators 7 are included between polarizer 5 and polarization analyzer 8 to ensure that the modulator 6 operates in the zeroth order of net phase retardance). The intensity-modulated output pulse is directed into a spectrograph whose detector array is coupled to a spectrum analyzer. Output from the detector array may be viewed as a spatial representation of the modulated pulse as a function of frequency and thus, due to time-dependent frequency dispersion, as a function of time.

At this point of operation it is possible, upon subtraction of the shape of the unmodulated phase from that of the modulated pulse, to recover the shape of the waveform of interest. If the shape of the unmodulated pulse is sufficiently well known in advance, this subtraction can be carried out by reference to a permanently stored waveform. Alternatively, it may be appropriate to transmit, from time to time, an unmodulated pulse along the path of the probe beam to furnish the spectrum analyzer with the unmodulated pulse shape; this is conveniently effected by having chopper 12 prevent the triggering of device 13. For example, under conditions of repetitive operation, sensing a signal of interest and furnishing the spectrum analyzer with the unmodulated pulse form may be effected by simple alternation between triggered and untriggered operation. Repetitive operation can further be used to obtain a smoothed representation of a signal by averaging over a series of individual representations.

Figure 2:
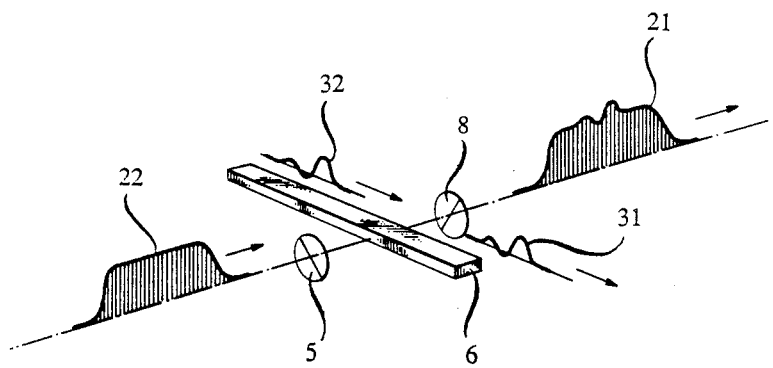
FIG. 2 is a schematic illustration facilitating appreciation of the operation of the arrangement shown in FIG. 1.

Optical polarizer 5, modulator 6, and polariziation analyzer 8 are shown also in FIG. 2 which further shows a frequency-swept, modulated optical pulse 21 traveling away from polarization analyzer 8. The corresponding modulating signal 31 is shown moving along modulator 6. Shown also is a second, unmodulated probe pulse 22 traveling towards modulator 6, and a second electrical signal 32 traveling along modulator 6.

As described above, short-duration (high-bandwidth) optical pulses are conveniently obtained from a femtosecond-pulsed laser. Suitable pulses having frequencies in an interval in the optical range from ultraviolet to infrared can also be obtained by other means such as, e.g., the nonlinear frequency expansion of a picosecond pulse.

While the description above is in terms of the modulation of a probe pulse whose duration is comparable to that of the modulating signal, it is possible also, in the case of a longer signal of interest, to obtain representations of portions of such signal by simple adjustment of the delay line to different lengths. Conversely, adjustment of delay line length can be used with signals much shorter than the measurement window to investigate the frequency distribution in the probe pulse. For example, linearity of frequency distribution in the probe pulse can be induced if the shape of a received waveform is independent of the portion of the probe pulse used for modulation.

Finally, as mentioned above, the invention has communications aspects in that a modulating signal may represent information such as, e.g, voice, data, or graphical information. In such applications it may be desirable, in the interest of reduced pulse length, to pass the modulated pulse through a medium having dispersive characteristics complementary to those of the medium used for dispersion prior to modulation. In this way, frequency compression and pulse shortening can be realized.

In communications use of the invention, spectral analysis of a modulated optical pulse typically occurs after transmission over a considerable distance and, in the course of such transmission, a considerable amount of unintentional frequency dispersion may result in a dispersive transmission medium such as, e.g., an optical fiber. Spectrographic analysis at the receiver results in a special benefit of the invention as compared with other methods of communication in that demodulation is not affected by dispersion during transmission.

EXAMPLE

An arrangement as schematically depicted in FIG. 1 was used to determine the electrical pulse response of an ion-bombarded gallium arsenide photoconductive detector. Optical pulses having a width of 50 femtoseconds and a transform-limited bandwidth of approximately 9.5 nanometers were generated at a rate of 100 megahertz by a balanced, colliding-pulse, mode-locked dye laser. The probe pulses were stretched out to a width of approximately 300 picoseconds by a polarization-preserving, single-mode optical fiber having a length of approximately 50 meters.

The gallium arsenide device was attached to the end of a 250-micrometer-thick, balanced-line, traveling-wave lithium tantalate electrooptic modulator across which the electrical signal propagated. The modulator arrangement was optically biased close to zero transmission in order to maximize the modulation depth of the transmitted light even at the low overall intensity level at this point. (Such biasing in the interest of enhanced modulation of small-amplitude signals is desirable because, even near zero transmission, the modulation depth resulting from picosecond signals can be less than $10^{-3}$, and the dynamic range of the multichannel analyzer is approximately $10^4$.)

A 0.3-meter spectrograph was used in combination with a 1024-element Reticon array and OMA-II spectrum analyzer. This system has a resolution of approximately 0.04 nanometer and thus can resolve 237 points within the spectrum of the probe pulse, yielding a resolution of 42 femtoseconds. Convolution with the original pulse duration yields a true temporal limit of approximately 65 femtoseconds, far exceeding the modulator's capabilities. (The temporal resolution of this system is determined by convolving the original pulse duration with a time given by the stretched pulse duration divided by the ratio of pulse bandwidth to spectrograph resolution.

A pulsed signal representation was obtained having a width of approximately 10 picoseconds as measured at a level corresponding to one-half of the peak level. The signal had a rise time of approximately 5 picoseconds.

What is claimed is:
1. A method of transmitting a time-dependent signal, said method comprising
    (i) generating a sub-nanosecond optical pulse having time-dependent spectral variation,
    (ii) electro-optically, magneto-optically, or opto-optically modulating the amplitude of said pulse in time-dependent fashion in correspondence with said time-dependent signal, thereby altering the spectral content of said pulse, and

(iii) determining the spectral content of said pulse as so altered.

2. The method of claim 1 in which said spectral variation is essentially unidirectional as a function of time.

3. The method of claim 2 in which said spectral variation is essentially linear as a function of.

4. The method of claim 1 in which a representation of said signal is obtained from the determined spectral content.

5. The method claim 1 in which said signal is generated by a device.

6. The method of claim 1 in which said signal is generated by a material.

7. A device for transmitting a time-dependent signal, said device comprising
 (i) means for generating a sub-nanosecond optical pulse having time-dependent spectral variation,
 (ii) means for electro-optically, magneto-optically, or optooptically modulating the amplitude of said pulse in timedependent fashion in correspondence with said time-dependent signal, thereby altering the spectral content of said pulse, and
 (iii) means for determining the spectral content of said pulse as so altered.

8. The device of claim 7, said means for generating an optical pulse comprising a laser.

9. The device of claim 7, said means for generating an optical pulse comprising an optical fiber.

10. The device of claim 7, said means for modulating the amplitude comprising an electrooptic medium.

11. The device of claim 7, said device comprising means for causing said signal to reach said modulating means in synchronicity with said optical pulse.

12. A method of communication, said method comprising transmitting at least one time-dependent signal, transmission of said signal comprising
 (i) generating a sub-nanosecond optical pulse having time-dependent spectral variation,
 (ii) electro-optically, magneto-optically, or opto-optically modulating the amplitude of said pulse in time-dependent fashion in correspondence with said time-dependent signal, thereby altering the spectral content of said pulse, and
 (iii) determining the spectral content of said pulse as so altered.

13. A transmitter for optical communications, said transmitter comprising
 (i) means for generating a sub-nanosecond optical pulse having time-dependent spectral variation,
 (ii) means for electro-optically, magneto-optically, or opto-optically modulating the amplitude of said pulse in time-dependent fashion is correspondence with said time-dependent signal, thereby altering the spectral content of said pulse, and
 (iii) means for transmitting the amplitude-modulated pulse for determination of the spectral content of said pulse as so altered.

* * * * *